(12) United States Patent
Sakata et al.

(10) Patent No.: US 9,191,030 B2
(45) Date of Patent: Nov. 17, 2015

(54) MEMORY CONTROLLER, DATA STORAGE DEVICE, AND MEMORY CONTROLLING METHOD

(71) Applicants: Akihiro Sakata, Kanagawa (JP); Yoshinobu Kimura, Kanagawa (JP)

(72) Inventors: Akihiro Sakata, Kanagawa (JP); Yoshinobu Kimura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 121 days.

(21) Appl. No.: 13/693,360

(22) Filed: Dec. 4, 2012

(65) Prior Publication Data
US 2013/0173986 A1 Jul. 4, 2013

(30) Foreign Application Priority Data
Dec. 28, 2011 (JP) ................................. 2011-289074

(51) Int. Cl.
*H03M 13/29* (2006.01)
*G06F 11/10* (2006.01)

(52) U.S. Cl.
CPC ........... *H03M 13/29* (2013.01); *G06F 11/1004* (2013.01); *H03M 13/2906* (2013.01)

(58) Field of Classification Search
CPC . G06F 11/1004; G06F 11/1008; G06F 11/10; G06F 11/108; G06F 11/1417
USPC .................. 714/E11.036, 719, 758, 763–764, 714/769–771, 755, 786; 365/201; 711/114
See application file for complete search history.

(56) References Cited

U.S. PATENT DOCUMENTS

| | | | | |
|---|---|---|---|---|
| 5,793,774 A | * | 8/1998 | Usui et al. | 714/719 |
| 6,769,087 B2 | * | 7/2004 | Moro et al. | 714/763 |
| 7,562,285 B2 | * | 7/2009 | Yang et al. | 714/815 |
| 2006/0218467 A1 | * | 9/2006 | Sibigtroth et al. | 714/763 |
| 2008/0104480 A1 | * | 5/2008 | Tseng et al. | 714/758 |
| 2008/0133994 A1 | * | 6/2008 | Oh | 714/746 |
| 2009/0063934 A1 | * | 3/2009 | Jo | 714/764 |
| 2010/0211834 A1 | | 8/2010 | Asnaashari et al. | |
| 2012/0131382 A1 | * | 5/2012 | Higeta | 714/6.13 |
| 2014/0115419 A1 | * | 4/2014 | Ahn et al. | 714/758 |

FOREIGN PATENT DOCUMENTS

| | | |
|---|---|---|
| JP | 2007-310803 A | 11/2007 |
| JP | 2008-159152 | 7/2008 |

OTHER PUBLICATIONS

Japanese Office Action, Patent Application No. 2011-289074, dated Aug. 19, 2014.

* cited by examiner

*Primary Examiner* — Guy Lamarre
(74) *Attorney, Agent, or Firm* — Patterson & Sheridan, LLP

(57) ABSTRACT

A memory controller includes a first error detection code generator for generating a first error detection code for data received from a host, a controller to write the data and the first error detection code to nonvolatile memory and to read the data and the first error detection code from the nonvolatile memory, an error detector to perform an error detection based on the data and the first error detection code that are read from the nonvolatile memory, a second error detection code generator to generate a second detection error code based on the data read from the nonvolatile memory, and a mismatch code generator to generate a mismatch code signaling the presence of an error in the data, wherein either the second error detection code or the mismatch code is selected based on the error detection and sent to the host.

17 Claims, 8 Drawing Sheets

MEMORY CONTROLLER, DATA STORAGE DEVICE, AND MEMORY CONTROLLING METHOD

CROSS-REFERENCE TO RELATED APPLICATION

This application is based upon and claims the benefit of priority from Japanese Patent Application No. 2011-289074, filed Dec. 28, 2011; the entire contents of which are incorporated herein by reference.

FIELD

Embodiments described herein relate generally to a memory controller, data storage device, and memory control method.

BACKGROUND

Recent advances in semiconductor memory devices, including consumer-oriented data storage devices such as SSD (Solid State Drive), etc. that use nonvolatile semiconductor memory, have highlighted the need for error detection and correction, where the error may be caused by a cosmic ray and the like.

Error checking and correction (ECC) has conventionally been used in NAND flash memory chips. However, with ECC methods, a path from input of data from a host to the generation of the ECC code is not protected. Hence when errors occur as data is transmitted through the unprotected section, they are not detected and the data storage device ends up storing bad data with no error indication.

DETAILED DESCRIPTION

According to one embodiment, a memory controller, data storage device and memory control method are explained in detail by referring to the attached drawings. However, the present disclosure is not limited to this embodiment.

According to one embodiment, there is provided a memory controller, data storage device and memory control method which may detect errors in the entire data path from input of the data to the data storage device by the host through writing to a media part and from reading from a media part to output of the data to the host.

In general, this embodiment includes a memory controller for controlling the storage of nonvolatile data, which includes a first error detection generator unit to generate a first error detection code for data received from a host, a controller to write the data and its associated first error detection code to the memory; an error detector to read the data and its first error detection code from the memory to the host and perform error detection based on the data and the first error detection code read from the memory in response to a read request for the data, a second error detection code generator that generates a second error code based on the data read from the memory, and a mismatch detector to generate a mismatch code to signal the presence of errors in the data read from the memory, wherein either the second error detection code or the mismatch code is selected based on the error detection results and added to the data read from memory and sent to the host.

Figure 1:
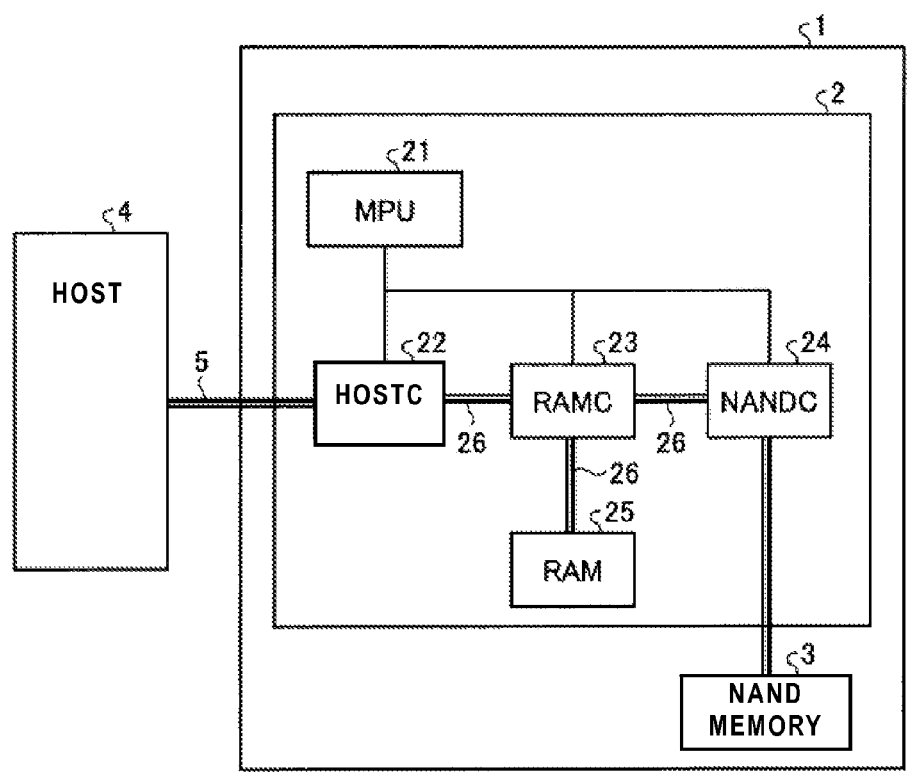
FIG. 1 is a block diagram showing a configuration example of a data storage device.

FIG. 1 is a block diagram showing a configuration example of a data storage device in this embodiment. As shown in FIG. 1, a data storage device 1 has a memory controller 2 and a NAND memory 3. The data storage device 1 is connected to a host 4 via a host bus 5. The host 4 may be, for example, an electronic device such as a personal computer, portable terminal, etc. In FIG. 1, data buses are indicated by a combination of thick line and thin lines while control buses are indicated by a thin line only.

The memory controller 2 possesses an MPU (Micro Processing Unit) (MPU, also referred to as "controller") 21, a host controller 22, a Random. Access Memory (RAM) controller (RAMC) 23, a NAND controller (NANDC) 24, and a RAM 25. The host controller (HOSTC) 22 and the RAMC 23, the RAMC 23 and the NANDC 24, and the RAMC 23 and the RAM 25 are connected, respectively, by an internal data bus 26.

The host controller 22 executes a processing according to the standard interface between the host controller and the host 4 and outputs in order the data received from the host 4 via the host bus 5 to the internal bus 26. Furthermore, the host controller 22 transmits data input via the internal bus 26, or a response from the MPU 21 to the host 4 via the host bus 5.

A Serial Advanced Technology Attachment (SATA) may be used as the standard interface between the host 4 and the data storage device 1. In SATA, data is transmitted in Frame Information Structure (FIS) chunks. A Cyclic Redundancy Check (CRC) corresponding to the FIS chunk to be transmitted, hereinafter called FIS CRC, is generated and stored after the relevant data. The FIS CRC may be used to detect errors in the host bus 5. Although the example discussed here employs the SATA as the standard interface between the host 4 and the data storage device 1, it is not limited thereto. Other interfaces may be used such as a Peripheral Component Interconnect (PCI) Express, which transmits data in Transaction Layer Packet (TLP) packets. TLP adds an ECRC (Transaction Layer end-to-end 32 bit CRC) to the transmitted data from which errors in the host bus 5 may be detected.

The MPU 21 is the overall controller for each part of the data storage device 1. Although the MPU is described herein as a controller, other units having an arithmetic function may be used instead. The MPU 21 controls operations in response to commands received from the host 4 via the host controller 22. For instance, the MPU 21 controls the NANDC 24 to write data to and read data from the NAND memory 3, as instructed by the host 4.

The RAM 25 temporarily holds data received from the host 4 via the memory controller 2 prior to storage in the NAND memory 3, and holds data read from the NAND memory 3 prior to transmission to the host 4. The RAM 25 may also hold the error detection or error correction codes added to the data. The RAMC 23 controls writing and reading of data to and from the RAM 25 as directed by the MPU 21.

The data storage device 1 shown in FIG. 1 is just one example and embodiments are not limited thereto. In addition, other memory devices such as magnetic disks, etc., may be used in place of the NAND memory 3.

Figure 2:
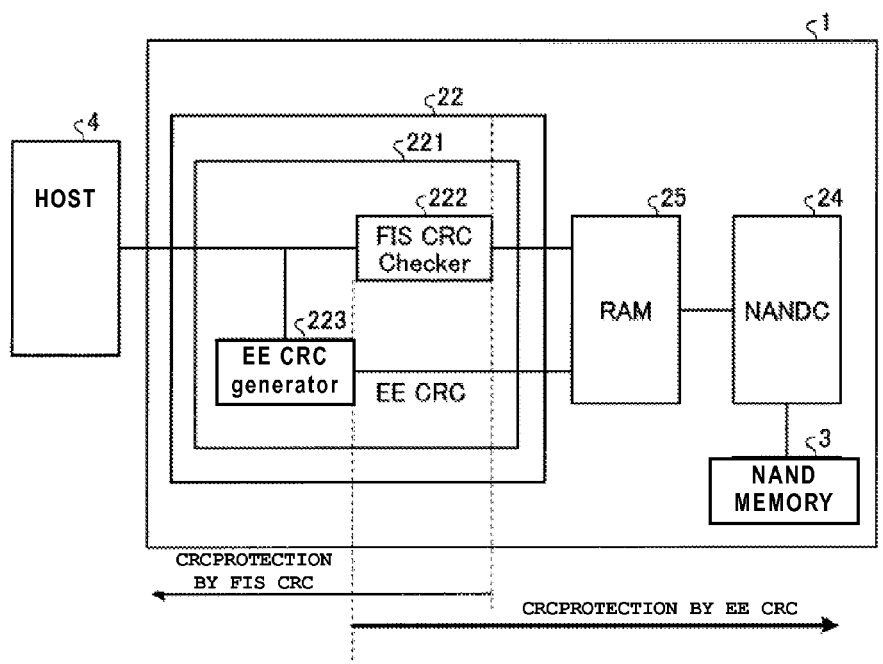
FIG. 2 shows a detailed configuration example of a host write controller.

Next, it will be explained how data are written to the NAND memory 3 according to an embodiment. FIG. 2 shows a detailed configuration example of the host controller 22 for writing. A write processor 221 is a block in the host controller 22 for handling writing of data to the NAND memory 3. The write processor 221 has an FIS CRC checker 222 and an EE CRC generator 223. FIG. 2 omits part of the block shown in FIG. 1 to clarify the data flow, and the connections are also simplified.

The host 4 holds the data and the FIS CRC associated with the data and transmits them to the data storage device 1. There is other data besides the data and FIS CRC in the FIS chunk which is received and sent, but this is performed in the standard way and we omit further explanation.

In this embodiment, the data storage device 1 generates an end-to-end error code for error detection along the entire data path starting from when data is received from the host 4, through writing and reading the data, and ending with when data is transmitted to the host. This end-to-end error detection code is called the EE CRC (first error detection code) in this embodiment and is to be distinguished from the FIS CRC (second error detection code).

The host controller 22, when receiving a write command instructing writing of the data from the host 4, acknowledges the write command to the MPU 21. The FIS CRC error checker 222 in the host controller 22, when receiving write data from the host 4, uses the write data and its FIS CRC code to check for errors. Data for which no error is detected is stored in the RAM 25. If an error is found by the FIS CRC checker 222, an error alert or similar is sent to the host 4 in compliance with the interface standard used.

The EE CRC generator 223 in the host controller 22, in parallel to the CRC error checker 222, generates an EE CRC code based on the write data received from the host 4, the EE CRC code also being stored in the RAM 25. Although the example discussed here employs CRC32 as the EE CRC, other codes may be used for EE CRC error detection so long as they are error detection codes.

The MPU 21 instructs the RAMC 23 to read the write data from the RAM 25 along with the associated EE CRC code stored in the RAM 25 and send it to the NANDC 24. The MPU21 also instructs the NANDC24 to write the sent data to the NAND memory 3. The MPU 21 manages logical addresses of data received from the host to physical addresses in the NAND memory 3.

Figure 3:
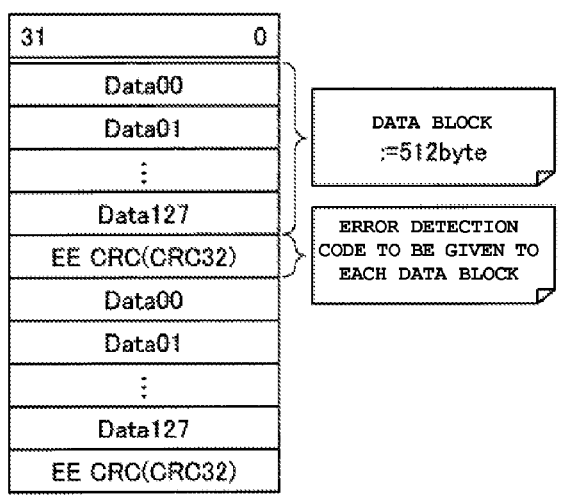
FIG. 3 shows an example of a data format in a NAND memory.

FIG. 3 shows an example of a data format used in the NAND memory 3. Here the EE CRC code is generated for one block of data (512 Bytes), and as shown in FIG. 3, the EE CRC code is appended to each block. Although the block size here is 512 byte, it is not limited thereto, and other block sizes such as 2048 or 32 bytes may be used. Moreover, EE CRC code generation need not be per-block, and may be per plural data blocks or per data unit that is smaller than one data block.

Since the EE CRC code and associated data are written to the NAND memory 3, the path from EE CRC code generation to NAND memory 3 is protected by EE CRC. That is, any errors occurring along this path may be detected. As in the ordinary case, the data path from the host 4 to the FIS CRC error checker 222 is been protected by FIS CRC. Hence in the present embodiment, the entire data path from the host 4 to the NAND memory 3 is protected for writing as shown in FIG. 2.

Figure 4:
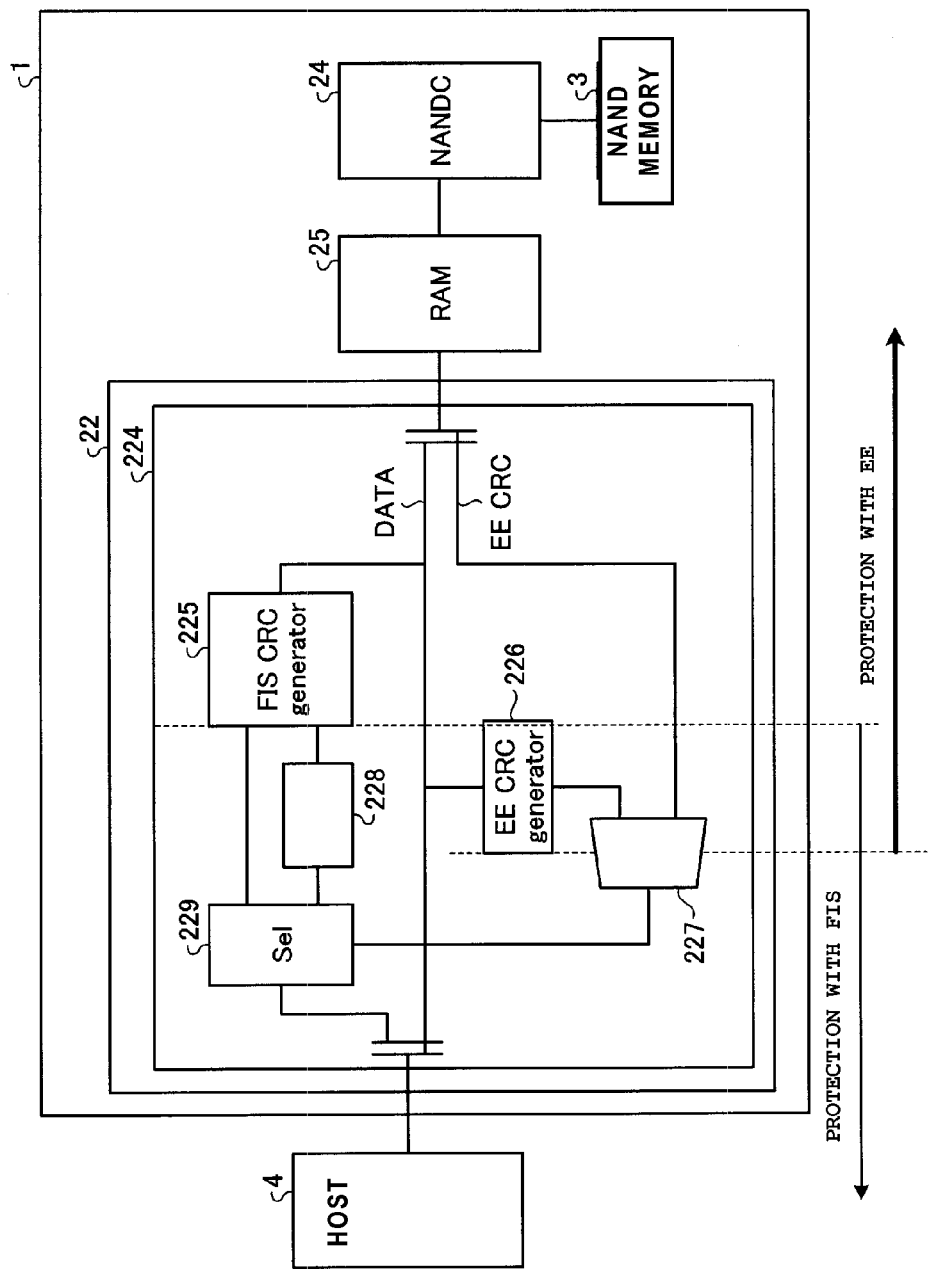
FIG. 4 shows a detailed configuration example of a host read controller.

Next, it will be explained how data is read from the NAND memory 3 according to an embodiment. FIG. 4 shows a detailed configuration example of the host controller 22 for reading. A read processor 224 is a block for handling reads from the NAND memory 3 in the host controller 22. It contains an FIS CRC generator 225 (the second error code generator), an EE CRC generator 226, a comparator 227, a bit inverter (mismatch code generator) 228, and a selector (Sel) 229. The EE CRC generator 223 of the write processor 221 may be used as the EE CRC generator 226. FIG. 4 omits part of the block described in FIG. 1 in order to clarify the data flow, and the connections are also simplified.

Figure 5:
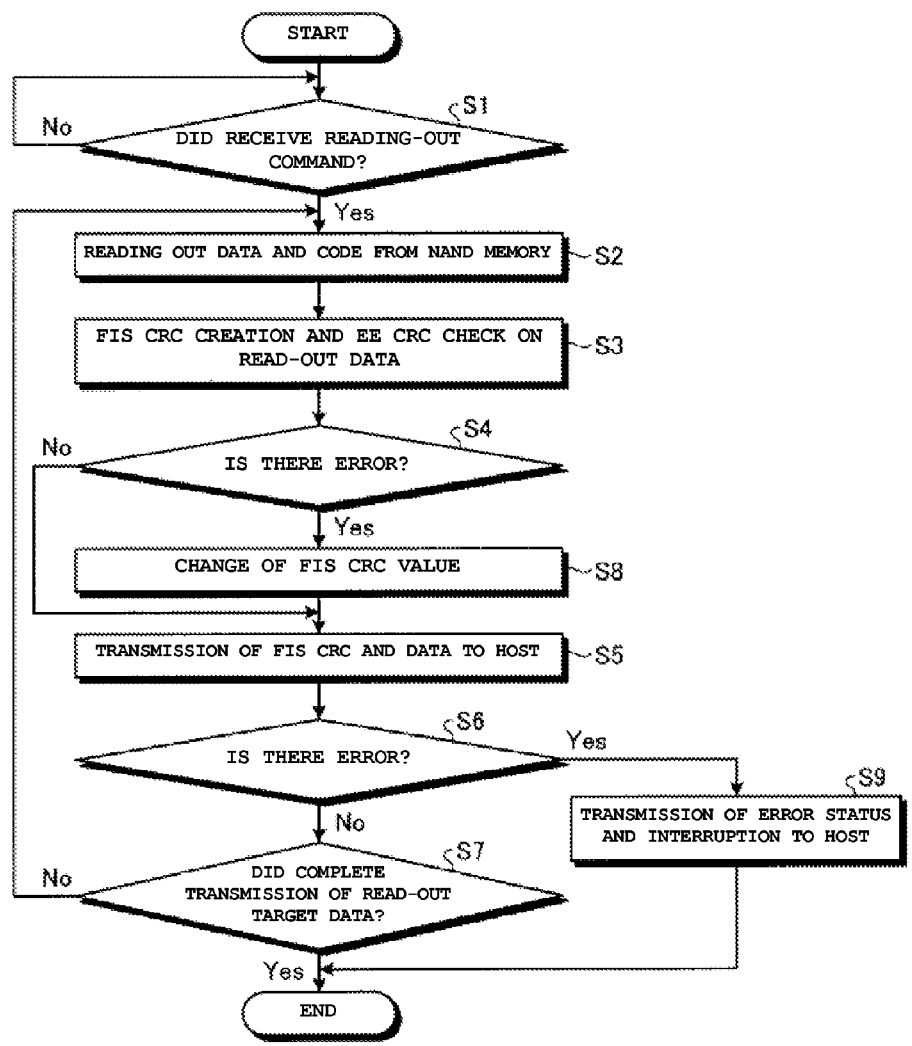
FIG. 5 is a flowchart showing an example of the steps used to read data in a NAND memory.

FIG. 5 is a flowchart showing the steps used to read data according to an embodiment. First, the host controller 22 of the memory controller 2 determines whether a read command instructing reading of the data has been received from the host 4 (step S1). The read target address is contained in the read command.

When the read command has been received (step S1, Yes), the host controller 22 acknowledges it to the MPU 21, which then instructs the NANDC 24 to read from the target as instructed by the host 4, along with the corresponding EE CRC code, from NAND memory 3 (step S2). The NANDC 24 holds the data and the EE CRC code read from the NAND memory 3 in RAM 25.

The host controller 22 generates an FIS CRC code based on the data held in the RAM 25 (read from the NAND memory 3) while also performing an error detection (EE CRC check) based on the data and the EE CRC in the RAM 25 (step S3).

More specifically, the data read from RAM 25 is input to the FIS CRC generator 225 in the host controller 22 and the EE CRC generator 226 and output to the host 4. While this is occurring, the FIS CRC generator 225 of the host controller 22 generates an FIS CRC code for the data read from RAM 25 and outputs it to the selector 229. The EE CRC generator 226 in the host controller 22 generates an EE CRC code for the data in RAM 25 and outputs the result to the comparator 227. The EE CRC code read from RAM 25 is also input to the comparator 227. The comparator 227 compares the EE CRC generated by the EE CRC generator 226 with the EE CRC read from the RAM 25 to determine whether or not they agree, and outputs the result to the selector 229. If the codes in the comparator 227 agree, there is no error in the data input to the EE CRC generator 226. If the codes do not agree, an error in the data input to the EE CRC 226 is determined to have occurred somewhere in the path of the data input to the EE CRC generator 226, that is, between input to the CRC generator 223 during writing and input to the EE CRC generator 226 during reading. This is how the EE CRC generator 226 and comparator 227 perform EE CRC error detection.

The output of the comparator 227 indicates whether an error is present (step S4). If no error has occurred (comparator 227 indicates "agreement") (step S4, No), the FIS CRC code and data are transmitted to the host (step S5). More specifically, the selector 229 selects either the FIS CRC code input from the FIS CRC generator 225 or the FIS CRC code output from a bit inverter 228 based on the comparator 227 and outputs it. When the comparator 227 signals "agreement", the selector 229 selects the FIS CRC input from the FIS CRC generator 225 and outputs it. The data is sent to the host 4 in the FIS format as mentioned above.

The host controller 22 determines whether the data transmitted has an error or not based on the response from the host 4 (step S6). If there is no error (step S6, No), the MPU 21 or the host controller 22 checks to see if all the data has been read from the read target and sent to the host 4 (step S7), and if the read is complete (step S7, Yes), reading stops. If sending the data read from the target to the host 4 has not completed (step S7, No), the process goes back to step S2. In step S6, the host 4 determines whether an error has occurred based on the received data and the FIS CRC and based on this the host controller 22 decides if an error has occurred. But the error decision at step S6 is not limited to this. For instance, the decision could be based on the result of step S4 or the result of error detection for data retransmitted by the host controller 22, or some combination of them.

On the other hand, when the comparator 227 signals "not agree" in step S4 (step S4, Yes), the host controller 22 replaces the FIS CRC created by the CRC generator 225 by a value signaling the presence of an error in the data (step S8) and it advances to step S5. In more detail, the bit inverter 228 inverts a bit in the FIS CRC created by the CRC generator 225 and outputs the result to the selector 229. When the comparator 227 detects "not agree", the selector 229 selects the FIC CRC after bit inversion by the bit inverter 228 and outputs it.

In the case where there is an error (step S6, Yes), the host controller 22 sends an error status and interrupt to the host 4 (step S9) and processing stops. In more detail, with the SATA interface, the error status and interrupt are transmitted in an FIS format called Register FIS Device to Host (RegD2H FIS). Accordingly, once an error is detected subsequent data is not transmitted even when the read target still contains data. However, other variants are possible and error detection need not always prevent reading of data and sending to the host 4 from continuing.

Even when no error is present (step S6, No) at step 6, a status (showing no error) and interrupt may be sent to the host.

Furthermore, the host controller 22 controls how the data read from the RAM 25 and the FIS CRC (or bit-inverted FIS CRC) outputted from the selector 229 are transmitted to the host 4 in compliance with the FIS format. The bit-inverted FIS CRC is sent to the host 4 as the FIS CRC corresponding to error-detected data.

Thus in the embodiment, when the comparator 227 signals "not agree" indicating an error in the data, the FIS CRC code is bit-inverted to ensure a mismatch and sent to the host 4. This informs the host 4 that there is error in data received from the data storage device 1.

The data path from the NAND memory 3 to the CRC generator 226 is protected by EE CRC, and the path from the FIS CRC generator 225 to the host 4 is protected by FIS CRC. This ensures that during a read, the entire data path from the NAND memory 3 to the host 4 is protected as shown in FIG. 4. As explained for the case of writing, the entire data path from the host 4 to the NAND memory 3 is protected, as are the paths involved in receiving data from the host 4, storing the data in NAND 3, reading it from NAND 3 and sending it to the host 4, including the time during which the data is held in NAND memory 3.

In the embodiment described above, when data is transmitted while the EE CRC of the data is being checked for errors, the FIS CRC is bit-inverted. Therefore, error detection prior to transmission to the host 4 may be carried out without reducing the transmission rate to the host 4. Although in the present embodiment an inverted FIS CRC is used to notify the host 4 of an error, other methods may be used to relay the results from the comparator 227 to the host 4.

In the embodiment, correction of data errors during storage of data in the NAND memory 3 is not mentioned, but it may be added. In the error correction for the NAND memory 3, an error correction code is generated for data with EE CRC and the data with EE CRC and error correction code are stored in the NAND memory 3. For a read, the EE CRC code and data after the error correction based on the error correcting code input to the host controller 22.

Figure 6A:
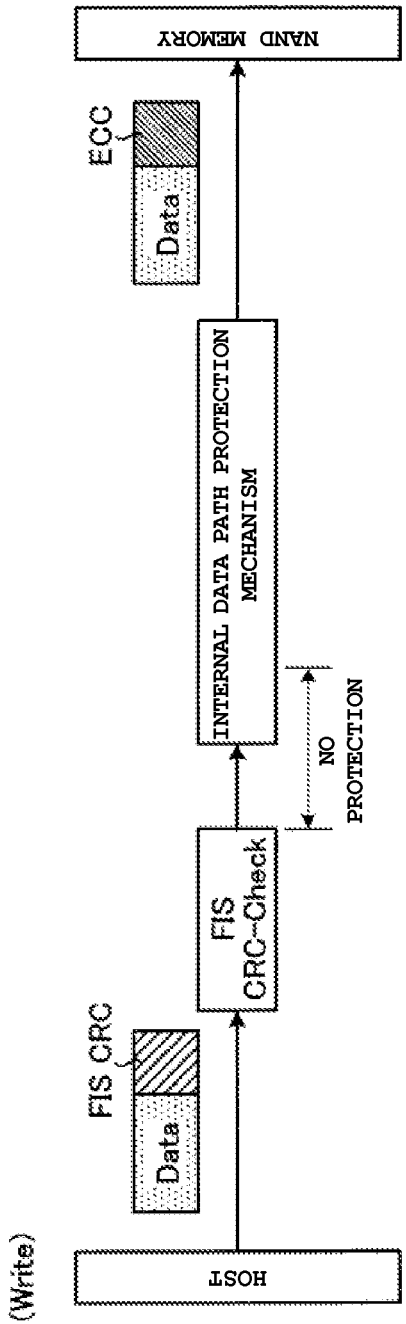
FIGS. 6A and 6B show an example data path error protection.
Figure 6B:
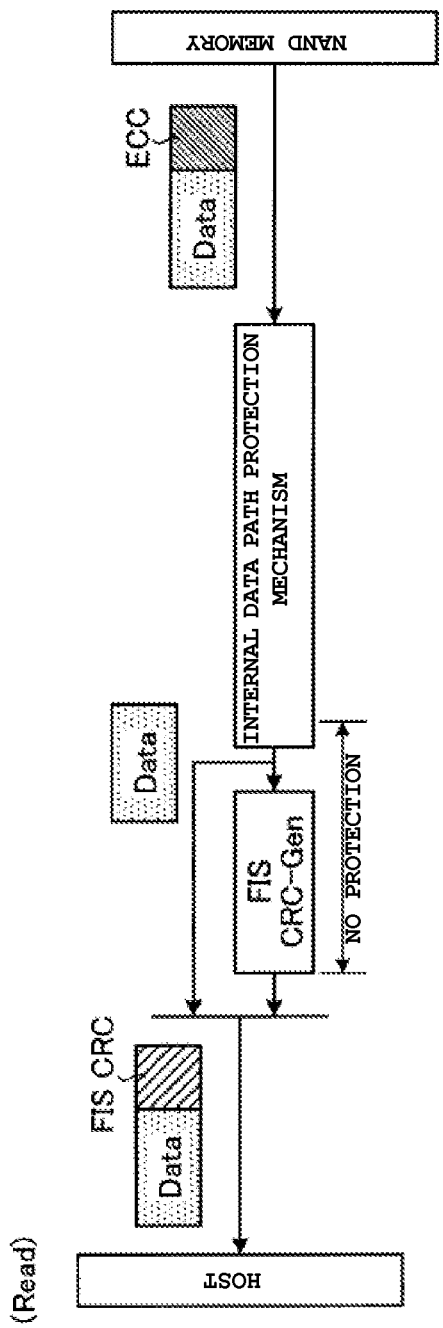
Figure 7A:
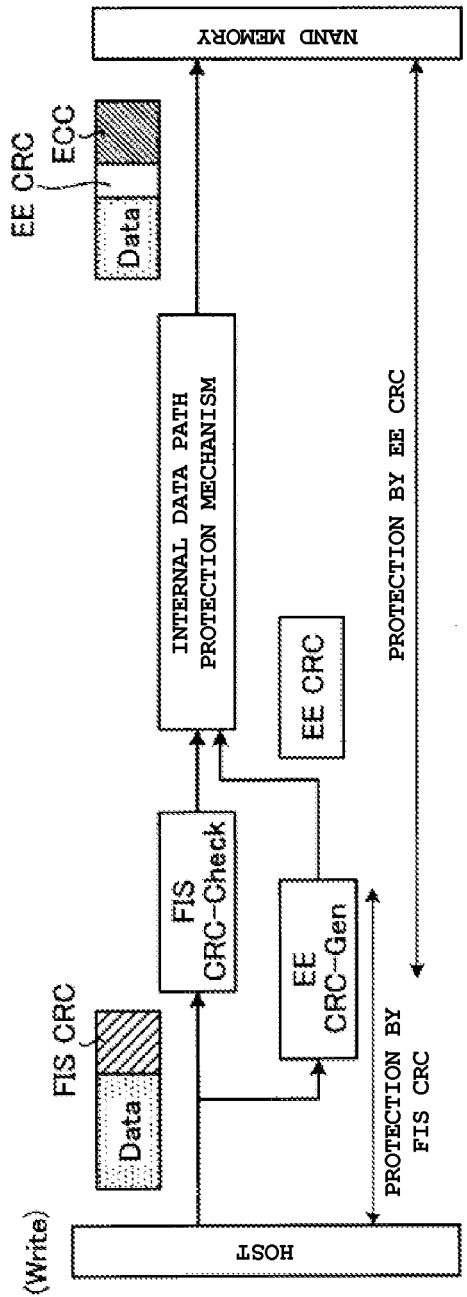
FIGS. 7A and 7B illustrate how errors in the data path are corrected according to an embodiment.
Figure 7B:
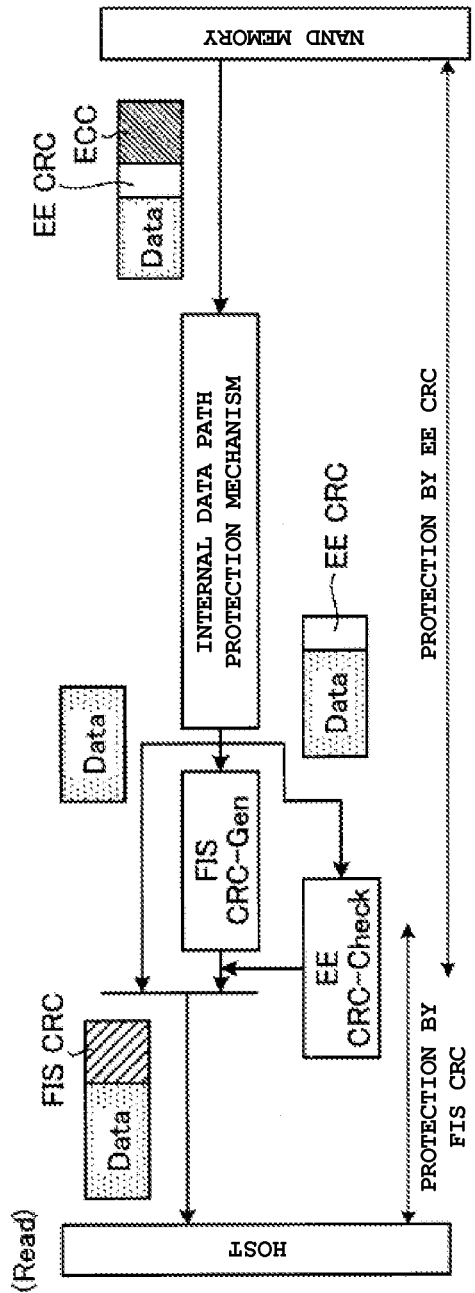

FIGS. 6A and 6B, and 7A and 7B illustrate data protection methods. FIGS. 6A and 6B show a method used in a comparative example to protect against errors in the data path. FIGS. 7A and 7B show a method according to an embodiment. In FIGS. 6A and 6B, and 7A and 7B, the case of error correction for NAND memory 3 is illustrated.

For the comparative example shown in FIGS. 6A and 6B, when data is written, an FIS CRC code is added from the host and error detection is performed by FIS CRC (FIS CRC-Check), then an error code (ECC) is generated by an internal path protection mechanism, and the data and the ECC are stored in NAND memory. For a read, the data and ECC are read from the NAND memory, and error-corrected using ECC, an FIS CRC code is generated for the data (FIS CRC-Gen), and the data and the FIS CRC are sent to the host. Consequently, there is a failure to protect the data during the time between error detection using FIS CRC and ECC generation by the internal path protection mechanism, and also between ECC in the internal path protection mechanism and FIS CRC code generation, even when the internal path protection mechanism performs ECC. If error correction for the NAND memory 3 is not carried out, data after the internal path protection mechanism and before storage in the NAND memory 3 is also unprotected.

In contrast to this, according to the embodiment, as shown in FIGS. 7A and 7B, EE CRC for data input from the host (EE CRC-Gen) is generated concurrently with FIS CRC error detection, and the EE CRC together with the data is stored in NAND memory. For a read, error detection (EE CRC-Check) using EE CRC is performed based on EE CRC after error correction processing using ECC and data. In this way, end-to-end protection of data may be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller for a nonvolatile memory, comprising:
    a host controller configured to receive data and a first error detection code from a host in association with a write request from the host, transmit the received data and a second error detection code to the nonvolatile memory for writing therein, receive the data and the second error detection code from the nonvolatile memory in response to a read request from the host, and transmit the data received from the nonvolatile memory to the host, wherein the host controller includes:
        a first error detector configured to detect an error of the data received from the host, based on the first error detection code, and send an error alert to the host when an error is detected;
        a first error detection code generator configured to generate the second error detection code based on the data received from the host, and regenerate the second error detection code based on the data received from the nonvolatile memory;
        a second error detector configured to compare the second error detection code received from the nonvolatile memory with the regenerated second error detection code, and generate a comparison result;

a second error detection code generator configured to generate the third error detection code based on the data received from the nonvolatile memory;

a mismatch code generator configured to generate a mismatch code, from the third error detection code, that indicates the presence of errors in the data received from the nonvolatile memory; and a selector configured to receive the third error detection code, the mismatch code, and the comparison result, select one of the third error detection code and the mismatch code based on the comparison result, and add the selected code to the data received from the nonvolatile memory and to be transmitted to the host.

2. The memory controller according to claim 1, wherein the third error detection code is selected when no error is detected by the second error detector, and
the mismatch code is selected when an error is detected by the second error detector.

3. The memory controller according to claim 2, wherein a SATA (Serial Advanced Technology Attachment) interface is used to transmit data to and from the host, and the third error detection code or the mismatch code is sent to the host as a CRC (Cyclic Redundancy Check) in FIS (Frame Information Structure) format.

4. The memory controller according to claim 3, wherein the selected code added to the data enables the host to check an error of the data transmitted to the host, and the host controller is further configured to receive a check result of the error from the host, determine whether or not the transmitted data has an error based on the check result, and send an error status as a Register FIS Device to Host (RegD2H FIS) in the FIS format when the transmitted data is determined to have an error.

5. The memory controller according to claim 1, wherein the mismatch code generator generates the mismatch code by inverting bits of the third error detection code.

6. The memory controller according to claim 1, wherein the nonvolatile memory comprises a nonvolatile semiconductor memory.

7. The memory controller according to claim 6, wherein the nonvolatile semiconductor memory comprises a NAND memory.

8. The memory controller according to claim 1, wherein the first error detection code is a CRC (Cyclic Redundancy Check) corresponding to the data received from the host.

9. A memory control method for a nonvolatile memory, comprising the steps of:
receiving a write request, data, and a first error detection code from a host;
checking an error of the data based on the first error detection code;
sending an error alert to the host when an error is detected by the checking;
writing the data and a second error detection code to the nonvolatile memory;
receiving a read request for the data from the host;
reading the data and the second error detection code from the nonvolatile memory;
generating a third error detection code based on the read data;
generating a fourth error detection code from the third error detection code;
after generating the third and fourth error detection codes, performing error detection based on the read data and the second error detection code; and
transmitting the read data and, based on the error detection, one of the third and fourth error detection codes, to a host.

10. The method of claim 9, further comprising:
transmitting the third error detection code with the read data to the host if the error detection that is performed indicates no error; and
transmitting the fourth error detection code with the read data to the host if the error detection that is performed indicates an error.

11. The method of claim 10, wherein the fourth error detection code is transformed from the third error detection code.

12. The method of claim 11, further comprising:
inverting all bits of the third error detection code to generate the fourth error detection code.

13. The method of claim 10, further comprising:
reading an error correction code (ECC) for the read data; and
performing an error correction on the read data using the ECC.

14. The method of claim 10, wherein the data and the second error detection code are received from the host over a SATA (Serial Advanced Technology Attachment) bus.

15. The method of claim 10, wherein each of the first, second, and third error detection codes is a cyclic redundancy check (CRC) code.

16. The method of claim 15, wherein the CRC code is in FIS (Frame Information Structure) format.

17. The method of claim 10, wherein
said one of the third and fourth error detection codes enables the host to check an error of the read data, and the method further comprises the steps of:
receiving a check result of the error from the host; and
sending an error status to the host as a Register FIS Device to Host (RegD2H FIS) in FIS (Frame Information Structure) format when the read data has an error.

* * * * *